United States Patent [19]

Stack et al.

[11] 4,309,653

[45] Jan. 5, 1982

[54] ELIMINATION OF LINE IMPEDANCE ERROR IN A THREE-WIRE PROBE INTERFACE

[75] Inventors: Timothy F. Stack, Enfield, Conn.; Richard W. Calcasola, Longmeadow, Mass.

[73] Assignee: United Technologies Corporation, Hartford, Conn.

[21] Appl. No.: 191,035

[22] Filed: Sep. 25, 1980

[51] Int. Cl.³ .............................................. G01K 7/16
[52] U.S. Cl. ............................... 323/369; 73/362 AR; 73/765; 323/909
[58] Field of Search .................... 73/362 AR, 765; 323/366, 369, 909; 324/62; 364/557, 863

[56] References Cited

U.S. PATENT DOCUMENTS 3,783,692 1/1974 Hansen ........................ 73/362 AR
3,805,616 4/1974 Sugiyama ......................... 324/62 X

*Primary Examiner*—A. D. Pellinen

*Attorney, Agent, or Firm*—Dominic J. Chiantera

[57] ABSTRACT

An RTD probe interface having a three-wire interconnection with a source excitation line, a source return line, and a sensed signal line, includes: an excitation signal source connected between the source excitation line and the source return line for providing an excitation current signal through the RTD; an amplifier having first and second signal inputs connected respectively to the source excitation line and the sensed signal line, for providing an output voltage signal at a magnitude proportional to the difference magnitude between the voltage signals present at the first and second amplifier inputs, and a bias signal source connected between the sensed signal line and the source return line for presenting a bias current signal to the sensed line, at a magnitude and phase equal to that of the excitation current signal, for providing equal line impedance dependent values in the voltage signals appearing at the first and second inputs of the amplifier.

5 Claims, 4 Drawing Figures

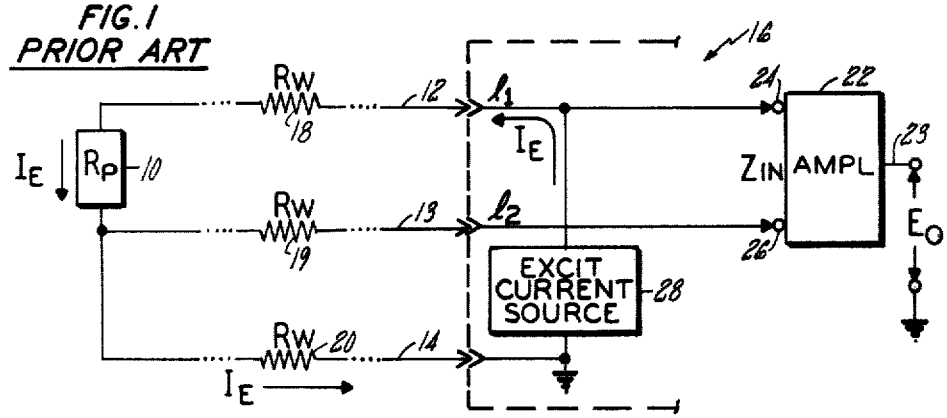
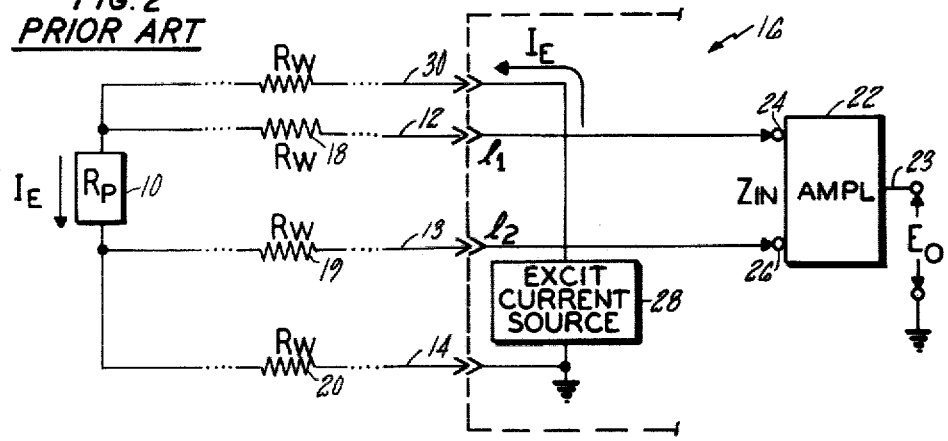
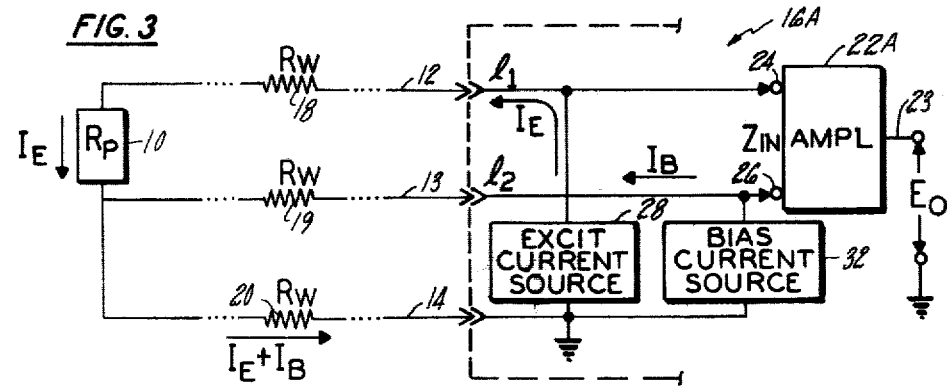

ELIMINATION OF LINE IMPEDANCE ERROR IN A THREE-WIRE PROBE INTERFACE

DESCRIPTION

1. Technical Field

This invention relates to signal conditioning interfaces, and more particularly to an interface for a three-wire resistive probe.

2. Background Art

As known, resistive probes, i.e. resistance temperature devices (RTDs) are useful in sensing temperature due to their calibrated resistance versus temperature characteristics. The sensed instantaneous resistance value of the RTD may be correlated to an associated temperature value. A signal conditioning interface provides the actual sensing of the RTD resistance value and provides an equivalent electrical analog signal, such as a current or voltage signal, representing the instantaneous RTD resistance value and hence the sensed temperature value.

In application the RTD is located within the environment or apparatus whose temperature is to be sensed; remote from the signal conditioning interface for the RTD. Since the sensed parameter is the instantaneous RTD resistance value, the distributed impedance associated with the interconnection between the RTD probe and the interface, primarily the line impedance of the interconnecting lines, may provide an appreciable error in the sensed temperature accuracy. The degree of this error is dependent both on the resistance value range of the RTD and the actual length of the interconnnection lines. In the present second generation Digital Flight Data Acquisition Unit (DFDAU) the typical RTD resistance range is sixty to two hundred and forty ohms, with a typical interconnection length of two hundred feet. This results in line impedance values on the order of three ohms, or 1.25% of the full scale RTD resistance value. With an overall required system accuracy of 0.5% of full scale (1.2 ohms) the line impedance error is obviously unacceptable.

The actual interconnection between the RTD and the interface may include any one of the number of known multiple conductor interconnects, e.g. two wire, three wire, or four wire. The two-wire interconnect includes the source excitation signal line and the source return line; the resistance value ($R_P$) is sensed across the same two lines. While this is the most economical it represents the worst configuration for line impedance dependency since the line impedance of both the source excitation line and source return line are included in the sensed instantaneous value of $R_P$. More commonly, a three-wire interconnection is used where the third wire, a sensed signal line, is connected in parallel with the source return line but is terminated in a high impedance at the interface so that it does not carry any of the probe excitation current. The advantage over the two-wire scheme is that it eliminates one of the line impedance errors. The most costly is the four-wire interconnection in which the resistance sensing loop is independent of the excitation loop; two wires are provided for carrying the RTD excitation current and the instantaneous RTD resistance value is sensed through the remaining two wires, each terminated in a high impedance in the interface. The two sensing lines do not carry any of the excitation current, such that the effect of line impedance is totally eliminated in sensing the RTD resistance value.

The four-wire interface represents the most costly in terms of both dollars and weight; the weight consideration being of primary concern in airborne applications. At present, however, the four-wire interface represents the optimum for highest sensed accuracy, and the three-wire RTD probe interface is relegated for use in those aircraft and industrial applications in which the line impedance error is acceptable.

DISCLOSURE OF INVENTION

The object of the present invention is to provide a three-wire RTD probe interface which eliminates line impedance dependency in sensing the probe resistance value.

According to the present invention, an RTD probe interface having a three-wire interconnection with a source excitation line, a source return line, and a sensed signal line, includes: an excitation signal source connected between the source excitation line and the source return line for providing an excitation current signal through the RTD; an amplifier having first and second signal inputs connected respectively to the source excitation line and the sensed signal line, for providing an output voltage signal at a magnitude proportional to the difference magnitude between the voltage signals present at the first and second amplifier inputs, and a bias signal source connected between the sensed signal line and the source return line for presenting a bias current signal to the sensed signal line, at a magnitude and phase equal to that of the excitation current signal, for providing equal line impedance dependent values in the voltage signals appearing at the first and second inputs of the amplifier, whereby the difference magnitude of the output signal provided by the amplifier is dependent only on the product of the excitation current signal magnitude multiplied by the instantaneous impedance value ($R_P$) of the RTD. In further accord with the present invention, the excitation signal source and the bias signal source are each active, constant current sources. In still further accord with the present invention, the bias signal source alternately comprises a voltage signal source connected with a series impedance between the source return line and the sensed signal line; the magnitude of the bias current signal being equal to the excitation current signal, and established by the ratio of the output voltage signal magnitude divided by the series impedance magnitude. In still further accord with the present invention the amplifier comprises a closed loop, proportional gain amplifier wherein the first and second signal inputs are each connected through selected value series impedances to the source excitation line and sensed signal line respectively, the series impedance values each having a magnitude much greater than that associated with the RTD and the line impedances of the three-wire interconnection, such that substantially all of the excitation current signal and the bias current signal flow through the three-wire interconnection and the RTD.

The three-wire probe interface of the present invention eliminates the line impedance errors associated with the prior art three-wire interfaces. This is achieved by use of a bias current signal having a phase and magnitude equal to that of the excitation current signal, which is injected into the three-wire interconnection line for providing a balanced dependency on line impedance on each of the two input voltage signals to the interface amplifier. The amplifier provides the output signal as the difference magnitude of the two input voltage signals, which causes a cancellation of the line impedance dependent portion of each input signal. As such the output signal from the interface is dependent solely on the instantaneous resistance value of the RTD.

These and other objects, features, and advantages of the present invention will become more apparent in light of the following detailed description of a best mode embodiment thereof, as illustrated in the accompanying drawing.

BRIEF DESCRIPTION OF DRAWING

FIG. 1 is a block diagram illustration of a prior art, three-wire probe interface;

FIG. 2 is a block diagram illustration of a prior art, four-wire probe interface;

FIG. 3 is a block diagram illustration of a three-wire probe interface according to the present invention.

BEST MODE FOR CARRYING OUT THE INVENTION

Figure 4:
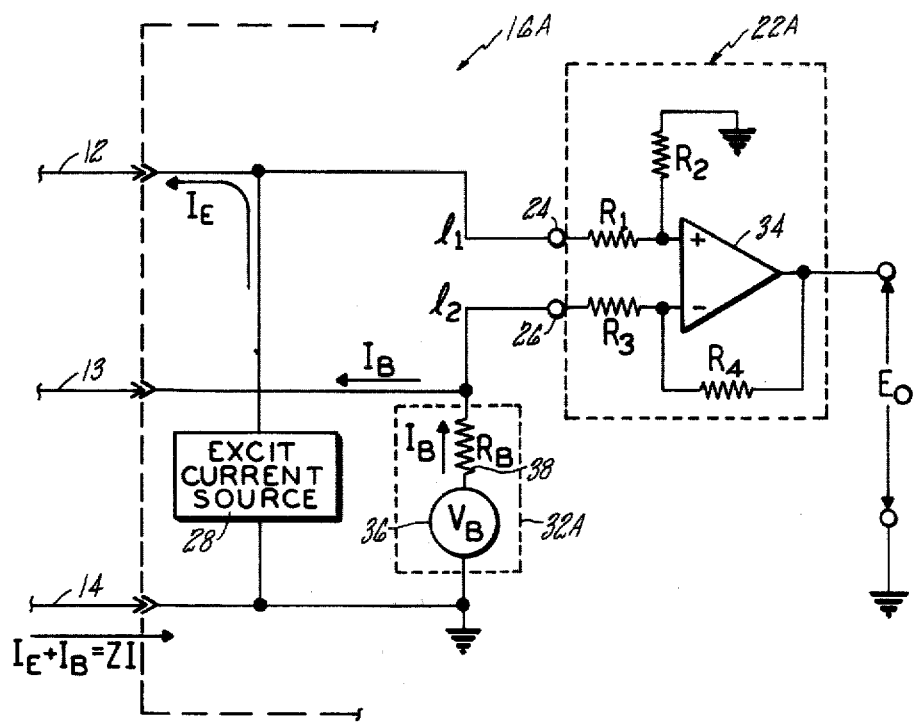
FIG. 4 is a detailed schematic illustration of a best mode embodiment of the three-wire probe interface of FIG. 3.

FIG. 1 is an illustration of a prior art, three-wire probe interface in which an RTD 10 is connected through the three-wire interconnect of lines 12–14 to a signal conditioning interface 16. The three lines 12–14 include: a source excitation line 12, a sensed signal line 13, and a source return line 14. The lines are of essentially equal length and have equal distributed resistance per unit length, as illustrated by the equal lumped impedance values ($R_w$) 18–20. The interface 16 includes an amplifier 22 having an output 23, and two inputs 24, 26 having an input impedance ($Z_{IN}$) which is much greater than the sum of the line impedance ($R_w$) and resistance ($R_P$) of the RTD. An excitation current source 28, i.e. an active, constant current source of a type known in the art, is connected between the source excitation line 12 and source return line 14, for providing a constant magnitude excitation current signal ($I_E$) through the lines to the RTD. Due to the high input impedance of the amplifier 22 essentially all of the excitation current flows through the RTD.

The excitation current through the RTD produces two input voltage signals, $e_1$, $e_2$ at the input of the interface on the lines 12, 13. Appendix A, Section I tabulates the equations describing each of the input voltage signals $e_1$, $e_2$ in terms of the excitation current, the distributed line impedance values and the instantaneous resistance value of the RTD. As shown in equations (2), (3) each of the input voltages includes a component which is a function of the distributed line impedance value. The input voltage $e_2$ is totally dependent on the product of the excitation current and the distributed line impedance of line 14 (the absence of current flow on the line 13 produces no voltage drop), whereas input voltage $e_1$ is a function of both the RTD instantaneous resistance value and the line impedance values of lines 12 and 14. The amplifier 22 provides the difference summation of the two input signals to produce an output signal $E_O$ which is proportional to the difference magnitude of the two input voltages. As shown in equation (4) this difference magnitude is equal to the product of the excitation current signal magnitude multiplied by the sum resistance of the RTD and one of the line impedance values. Since the distributed impedance value may be one percent or more of the full scale, or maximum value of $R_p$, this interface is unacceptable for high accuracy applications.

FIG. 2 illustrates a prior art, four-wire interconnection between the RTD 10 and interface 16. In the simplified illustrations of FIGS. 1, 2 the details of the interface 16 are identical, and include the amplifier 22 and excitation current source 28. The difference in the four-wire interface over the prior art three-wire configuration is the use of a fourth wire 30 which, in combination with the source return line 14, provides an isolated excitation current loop through the RTD. The excitation loop is independent of the sensed signal lines 12, 13 due to the high input impedance of the amplifier 22. There is essentially no current flow through the lines 12, 13; as such there is no voltage drop across these lines. Appendix A, Section II tabulates the equations for $e_1$, $e_2$ in the four-wire interface configuration (equations (6), (7)). In the four-wire interface the input voltage signal $e_1$ is, in addition to the RTD resistance value $R_p$, dependent on only one of the line impedance values; the same value as that associated with the input voltage signal $e_2$, i.e. the distributed impedance of the source return line 14. As such the two input voltage signals are "balanced" with respect to their dependency on line impedance, and the difference summation of the two input signals produces a direct cancellation of this common line impedance value. The output voltage signal $E_o$ (equation (8)) is proprotional only to the product of the excitation current signal multiplied by the instantaneous value of $R_p$. Of course, the price is the addition of the fourth wire; an expense both in terms of dollars and added weight which is the major concern for airborne applications.

FIG. 3 is a block diagram illustration of the three-wire probe interface of the present invention. Once again, in the simplified illustration of FIG. 3 the elements having common function with the interfaces of FIGS. 1, 2, have common reference numerals. The RTD 10 is connected through the three-wire interface (lines 12–14) to the interface 16A. The interface amplifier 22 provides an output voltage $E_O$ on the line 23 at a magnitude proportional to the difference magnitude between the input voltage signal magnitudes ($e_1, e_2$) presented to the amplifier inputs 24, 26. As before in input impedance ($Z_{in}$) of the amplifier inputs 24, 26 is much greater than the impedance of the RTD or interconnect. An excitation current source 28 is also connected between the source excitation line 12 and source return line 14 for providing the excitation current signal ($I_E$) through the lines to the RTD.

The departure of the interface of the present invention, as shown in FIG. 3, from the prior art interfaces of FIGS. 1, 2, is the addition of a bias current source 32 connected between the sensed signal line 13 and source return line 14. The phasing of the bias current source 32 with respect to the sensed signal line 13 is the same as the phasing of the excitation current source 28 with respect to the source excitation line 12, and it provides a bias current signal ($I_B$) having the same phase and magnitude as that of the excitation current signal. The bias source is a constant current source of a type known in the art, and may comprise an active constant current source identical to the excitation source 28. As such the bias current signal magnitude is constant; independent of the load impedance presented by the interface, the interconnection, and the RTD. Since the input impedance of the amplifier is much greater than the distributed line impedances or the RTD resistance, essentially all of the bias current flows into the sensed signal line 13 and circulates with the excitation current signal back through the source return line 14.

Appendix A, Section III lists in equations (11), (12) the expressions for the input voltages $e_1$, $e_2$ in the present three-wire interface. The phase and magnitude of the excitation current signal and bias current signal being equal ($I_E = I_B = I$, equation (10)), and the distributed line impedance values ($R_w$) of the lines 12-14 being equal, the input voltages $e_1$, $e_2$ are "balanced" with respect to their dependency on the line impedance values. They each have equal line impedance dependent values which, as shown, is equal to three times the product of the constant current magnitude (I) and the distributed line impedance ($R_w$); the input voltage $e_2$ being exclusively equal to this product and the input voltage $e_1$ being equal to the combination on this product together with the product of the constant current magnitude and the instantaneous resistance value $R_P$ of the RTD. The difference summation provided by the amplifier 22 results in cancellation of the equal line impedance dependent values and the magnitude of the output voltage signal $E_O$ (equation (13)) is dependent solely on the product of the constant current magnitude and the instantaneous impedance value $R_P$. It is independent of any line impedance factor.

FIG. 4 is a schematic illustration of the details of the amplifier 22A and bias current source 32 of FIG. 3, which reflects the best mode embodiment of the three-wire probe interface according to the present invention. In FIG. 4 the amplifier 22A includes a high gain operational amplifier 34, of a type known in the art, such as a National Semiconductor, LM148 having noninverting (+) and inverting (−) inputs connected through series resistors $R_1$, $R_3$ to the amplifier inputs 24, 26 respectively. The operational amplifier is strapped down in a closed loop with a feedback resistor $R_4$, and balanced at the noninverting input with balance resistor $R_2$. The input resistors $R_1$, $R_3$ have an impedance value selected to be much greater than the combination of the distributed line impedances associated with the interconnection scheme and the maximum impedance value of the RTD, such that there is no appreciable component of either the bias current or excitation current signals which flow into the amplifier circuit. Typically the input resistor values $R_1$, $R_3$ are equal, and for balance the feedback resistor $R_4$ is equal to the balance resistor $R_2$. As known, the amplifier 22A is a proportional gain type which provides the output voltage signal at a magnitude proportional to the difference magnitude between the input voltage signals $e_1$, $e_2$ presented to the input terminals 24, 26.

Instead of an active constant current source, the bias current source 32A may, as shown in FIG. 4, alternately comprise a voltage source 36 having an output voltage signal magnitude $V_B$ connected in series with a discrete impedance device, such as resistor 38, between the sensed signal line 13 and source return line 14. The series resistor 38 has an impedance value $R_B$. The combination voltage source 36 and series impedance 38 allows for further cost reduction, and provides a sufficiently accurate approximation of a constant current source due to the comparatively low impedance associated with the bias current path, i.e. the distributed impedance of the sensed signal line and source return line. The series resistor impedance value $R_B$ is selected to be much greater than the distributed line impedance so that the bias current $I_B = V_B/R_B$ is virtually constant.

The three-wire RTD probe interface of the present invention provides an output analog equivalent signal of the instantaneous resistance value of an RTD probe which is free of any dependency on the distributed line impedance values associated with the three-wire interconnection scheme. This results in an output voltage signal representation of the sensed resistance (and therefore sensed actual temperature) which equals the accuracy of a four-wire probe interface, but at a substantially reduced cost. This result is achieved through the use of a bias current of equal magnitude and phase to that of the RTD excitation current, which is back driven into the three-wire interconnection line and results in the balance of the sensed input voltage signals with respect to the distributed line impedances. The difference summation of the two input voltages through a proportional gain amplifier eliminates the equal line impedance dependent portion of each of the two input signals so as to produce an output signal which is solely proportional to the instantaneous impedance value of the RTD. The bias current signal may be provided through the use of an active constant current source, identical to that used for the excitation current signal. Alternatively, voltage source in series with a selected impedance value resistor, each scaled to produce a Thevenin equivalent of the constant current source, may be used as the bias current source; this provides for further cost reduction without any noticeable degradation in interface accuracy.

The three-wire probe interface of the present invention is ideally suited for high accuracy, airborne data acquisition applications. It may be used in combination with a multiplexed front end to provide a common signal conditioning interface for a number of different RTD probes. Similarly, although the invention has been described with respect to a best mode embodiment thereof, it should be understood by those skilled in the art that various other changes, omissions, and additions may be made therein and thereto without departing from the spirit and scope of the invention.

APPENDIX A

I PRIOR ART THREE-WIRE PROBE INTERFACE (FIG. 1)

| | |
|---|---|
| $Z_{in} >> R_w, R_p$ | (1) |
| $e_1 = I_E(2R_w + R_p)$ | (2) |
| $e_2 = I_E R_w$ | (3) |
| $E_o = e_1 - e_2 = I_E(R_w + R_p)$ | (4) |

II PRIOR ART FOUR-WIRE PROBE INTERFACE (FIG. 2)

| | |
|---|---|
| $Z_{in} >> R_w, R_p$ | (5) |
| $e_1 = I_E(R_p + R_w)$ | (6) |
| $e_2 = I_E R_w$ | (7) |
| $E_o = e_1 - e_2 = I_E R_p$ | (8) |

III PRESENT INVENTION THREE-WIRE PROBE INTERFACE (FIG. 3)

| | |
|---|---|
| $Z_{in} >> R_w, R_p$ | (9) |
| $I_E = I_B = I$ | (10) |
| $e_1 = I_E(R_w + R_p) + (I_E + I_B)R_w = I(3R_w + R_p)$ | (11) |
| $e_2 = I_B R_w + (I_E + I_B)R_w = I(3R_w)$ | (12) |
| $E_o = e_1 - e_2 = I R_p$ | (13) |

We claim:

1. Apparatus for providing a signal manifestation of the resistance value of a resistance temperature device (RTD), comprising:

interconnection means having three electrically conductive lines including a source excitation line connected at one end to one side of the RTD, and including a source return line and a sensed signal line each connected at one end to the other side of the RTD;

excitation signal source means, connected with selected polarity between the other ends of said source excitation line and said source return line for providing an excitation current signal therethrough to the RTD;

bias signal source means, connected with said same selected polarity between the other end of said sensed signal line and said other end of said source return line, for providing a bias current signal therethrough at a magnitude and phase equal to that of said excitation current signal; and amplifier means, having first and second inputs connected, respectively, to said other ends of said source excitation line and said sensed signal line, for providing as the manifestation of the RTD resistance value an output voltage signal at a magnitude proportional to the difference magnitude between the voltage signals appearing at said first and said second inputs in response to said excitation current signal and said bias current signal.

2. The apparatus of claim 1 wherein said excitation signal source means and said bias signal source means each comprise a constant current source.

3. The apparatus of claim 1 wherein:

said excitation signal source means is a constant current source; and said bias signal source means comprises a voltage signal source connected at one end, with said same selected polarity, through a series impedance value to said other end of said sensed signal line, and connected at the other end thereof to said other end of said source return line, said voltage source output signal magnitude and said series impedance magnitude being selectable so as to provide, through said sensed signal line and said source return line, said bias current signal at a substantially constant magnitude and at a phase equal to that of said excitation current signal.

4. The apparatus of claim 1, wherein said amplifier means includes a closed loop, proportional gain amplifier having a noninverting signal input and an inverting signal input, each connected through an associated series impedance value to said first input and said second input, respectively, of said amplifier means, each of said input series impedance values having a magnitude which is selectable so as to provide for substantially all of said excitation current signal magnitude and said bias current signal magnitude to flow through said interconnection means.

5. The method of providing a signal manifestation of the resistance value of a resistance temperature device (RTD) through a three-wire interconnection having a source excitation line connected at one end to one side of the RTD and having a source return line and a sensed signal line each connected at one end to the other side of the RTD, comprising the steps of:

presenting to the RTD through said source excitation line and returning through said source return line, a constant magnitude excitation current signal of selected polarity;

presenting through said sensed signal line and returning through said source return line a constant magnitude bias current signal at the same selected polarity and the same magnitude value as that of said excitation current signal; and providing, as the signal manifestation of the RTD resistance value, the difference voltage magnitude between the voltage signals appearing at said other ends of said source excitation line and said sensed signal line in response to said excitation current signal and said bias current signal.

* * * * *